United States Patent
Nagamine et al.

(10) Patent No.: US 7,154,261 B2
(45) Date of Patent: Dec. 26, 2006

(54) TESTER DEVICE, INSPECTION DEVICE, AND INTERCONNECTION BOARD RECEIVING UNIT FOR THE TESTER DEVICE AND INSPECTION DEVICE

(75) Inventors: Chisato Nagamine, Kanagawa (JP); Shigekatsu Maruyama, Kanagawa (JP)

(73) Assignee: Wintest Corporation (JP)

( * ) Notice: Subject to any disclaimer, the term of this patent is extended or adjusted under 35 U.S.C. 154(b) by 0 days.

(21) Appl. No.: 10/973,992

(22) Filed: Oct. 26, 2004

(65) Prior Publication Data

US 2005/0116728 A1    Jun. 2, 2005

(30) Foreign Application Priority Data

Oct. 27, 2003    (JP)    ............................. 2003-365943

(51) Int. Cl.
*G01R 31/28*    (2006.01)
(52) U.S. Cl. .................................................. 324/158.1
(58) Field of Classification Search ................ 324/754, 324/765, 158.1, 755; 439/66–72; 174/255; 361/719–720
See application file for complete search history.

(56) References Cited

U.S. PATENT DOCUMENTS 6,297,652 B1 *   10/2001   Shimoda et al. ............ 324/754
6,552,528 B1 *   4/2003    Frame ....................... 324/158.1
6,894,479 B1 *   5/2005    Siefers et al. ............ 324/158.1

FOREIGN PATENT DOCUMENTS

| JP | 2000-137058 | 5/2000 |
|----|-------------|--------|
| JP | 2000-147065 | 5/2000 |
| JP | 2003-209862 | 7/2003 |

* cited by examiner

*Primary Examiner*—Ha Tran Nguyen
*Assistant Examiner*—Tung X. Nguyen
(74) *Attorney, Agent, or Firm*—Harness, Dickey & Pierce, P.L.C.

(57) ABSTRACT

A tester device including a tester section which includes a tester, an interconnection board receiving unit fixed on the tester section, and a light source. The interconnection board receiving unit has first and second interconnection boards electrically connected to the tester in the tester section, and a contact section electrically connecting the second interconnection board to an external probe. A cut section for an optical-path is provided in the second interconnection board. The interconnection board receiving unit supports the second interconnection board so as to provide the cut section at the side of the tester section. The light source is moved between an inspection position at which the light source faces the cut section in the second interconnection board and an escape position at which the light source does not face the second interconnection board.

2 Claims, 10 Drawing Sheets

TESTER DEVICE, INSPECTION DEVICE, AND INTERCONNECTION BOARD RECEIVING UNIT FOR THE TESTER DEVICE AND INSPECTION DEVICE

Japanese Patent Application No. 2003-365943, filed on Oct. 27, 2003, is hereby incorporated by reference in its entirety.

BACKGROUND OF THE INVENTION

The present invention relates to a tester device which is connected with a prober device or a handler device, an inspection device in which the tester device is combined with a prober device, a handler device, or the like, and an interconnection board receiving unit for the tester device and the inspection device.

As an example of this type of inspection device, an inspection device in which a light source and a test head are swung on a hinge with respect to a prober device (prober) has been known (Japanese Patent Application Laid-open No. 2000-137058 and Japanese Patent Application Laid-open No. 2000-147065). In the LSI testers with a light source disclosed in Japanese Patent Application Laid-open No. 2000-137058 and Japanese Patent Application Laid-open No. 2000-147065, since a tester, an interconnection board, and a connector section including a pogo pin are disposed in the optical path from the light source to an inspection target disposed in the prober, the optical length is increased. Therefore, since light attenuates to a large extent in the optical path, the irradiation range on the inspection target in which a predetermined luminous intensity can be secured is limited. The irradiation range is narrower than the electrical performance range of the tester. Therefore, a region in which the inspection target can be inspected without moving the inspection target stepwise is limited by the irradiation range, whereby inspection throughput is limited.

In the LSI testers with a light source disclosed in Japanese Patent Application Laid-open No. 2000-137058 and Japanese Patent Application Laid-open No. 2000-147065, since the interconnection board inside the test head includes a functional board which is collectively provided with functions for each inspection target, it is necessary to replace the interconnection board each time the lot of the inspection target changes. However, since the interconnection board is provided inside the test head, the replacement operation takes time.

In the LSI testers with a light source disclosed in Japanese Patent Application Laid-open No. 2000-137058 and Japanese Patent Application Laid-open No. 2000-147065, since the installation area is increased by a manipulator which rotates the heavy test head with the light source, running cost of inspection is increased to such an extent that the LSI tester occupies an increased area in a cleanroom of which the cost per unit area is high.

Japanese Patent Application Laid-open No. 2003-209862 discloses an inspection device for a CCD device in which a light source is disposed above an inspection target and a connector section and a tester section are disposed below the inspection target. However, since this device requires a special handling device for the inspection target, it impossible to deal with a general-purpose prober or handler.

Japanese Patent Application Laid-open No. 2003-209862 also has a problem relating to the replacement operation of the interconnection board.

BRIEF SUMMARY OF THE INVENTION

According to a first aspect of the present invention, there is provided a tester device comprising:
a tester section which includes a tester;
an interconnection board receiving unit fixed on the tester section; and
a light source,
wherein the interconnection board receiving unit includes an interconnection board electrically connected to the tester in the tester section, and a contact section electrically connecting the interconnection board to an external probe;
wherein a cut section for an optical-path is provided in the interconnection board;
wherein the interconnection board receiving unit supports the interconnection board so as to provide the cut section at the side of the tester section; and
wherein the light source is moved between an inspection position at which the light source faces the cut section in the interconnection board and an escape position at which the light source does not face the interconnection board.

According to a second aspect of the present invention, there is provided a tester device comprising:
a tester section which includes a tester; and
an interconnection board receiving unit which is provided at one end of the tester section in a vertical direction and extends toward a side of the tester section,
wherein the interconnection board receiving unit includes:
an interconnection board electrically connected to the tester in the tester section;
a contact section electrically connecting the interconnection board to an external probe; and
an outer frame which holds the interconnection board and the contact section; and
wherein the interconnection board includes:
a first interconnection board electrically connected to the tester and disposed inside the outer frame and at a position facing the one end of the tester section; and
a second interconnection board electrically connected to the first interconnection board and the contact section, and disposed inside the outer frame and at the side of the tester section.

According to a third aspect of the present invention, there is provided an inspection device comprising:
any of the above-described tester devices; and
a prober device,
wherein the tester device is disposed in an upright state so that the contact section of the tester device is located at an upper position facing down to an inspection target disposed in the prober device.

According to a fourth aspect of the present invention, there is provided an inspection device comprising:
any of the above-described tester devices; and
a handler device,
wherein the tester device is disposed in an inverted state so that the contact section of the tester device is located at a lower position facing up to an inspection target disposed in the handler device.

According to a fifth aspect of the present invention, there is provided an interconnection board receiving unit comprising:
a first interconnection board electrically connected with an external tester;
a second interconnection board which is disposed horizontally adjacent to the first interconnection board and is electrically connected with the first interconnection board;

a connector which connects the first and second interconnection boards;

an inner frame on which the second interconnection board is provided;

a contact section which electrically connects the second interconnection board with an external probe;

an outer frame which holds the first interconnection board, the connector and the contact section and supports the inner frame so that the inner frame is able to move horizontally in directions toward and away from the connector; and a pushing mechanism of the inner frame, wherein the pushing mechanism of the inner frame includes:

guide pins and engagement holes provided on outer walls of opposite sides of the inner frame;

guide grooves which are formed on inner walls of opposite sides of the outer frame and guide the guide pins in vertical and horizontal directions;

a shaft rotatably provided between the sides of the outer frame; and projection pins formed on the shaft to engage the engagement holes in the inner frame.

DETAILED DESCRIPTION OF THE EMBODIMENTS

Figure 1:
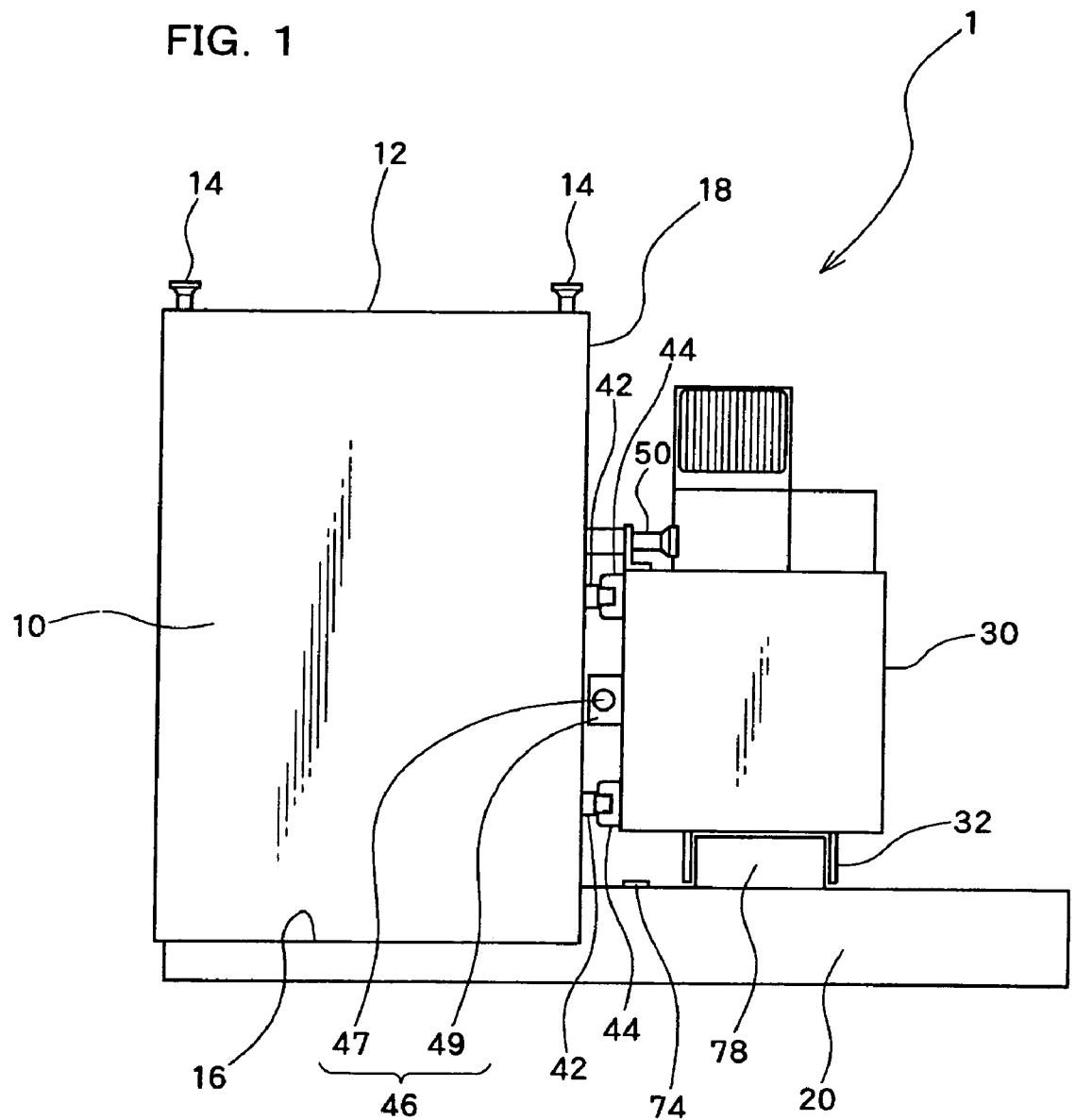
FIG. 1 is a front view of a tester device in an upright state according to one embodiment of the present invention.

The following embodiments of the present invention may provide a tester device and an inspection device which enable a replacement operation of an interconnection board connected to a tester or the like to be easily performed while reducing an optical path length from a light source to an inspection target, and an interconnection board receiving unit used therefor.

The embodiments may also provide a tester device and an inspection device requiring no manipulator for swinging a test head and enabling to reduce the running cost of inspection by reducing the installation area.

The embodiments may further provide a tester device and an inspection device which enable interconnection boards to be securely and easily connected, and an interconnection board receiving unit used therefor.

According to one embodiment of the present invention, there is provided a tester device comprising:

a tester section which includes a tester;

an interconnection board receiving unit fixed on the tester section; and a light source, wherein the interconnection board receiving unit includes an interconnection board electrically connected to the tester in the tester section, and a contact section electrically connecting the interconnection board to an external probe;

wherein a cut section for an optical-path is provided in the interconnection board;

wherein the interconnection board receiving unit supports the interconnection board so as to provide the cut section at the side of the tester section; and wherein the light source is moved between an inspection position at which the light source faces the cut section in the interconnection board and an escape position at which the light source does not face the interconnection board.

This tester device makes up an inspection device in combination with a prober device or a handler device. The tester in the tester section is connected to the probe provided in the prober device or the handler device through the interconnection board and the contact section, and the probe comes in contact with the inspection target. The inspection target is electrically measured by supplying a signal from the tester and monitoring an output signal from the inspection target. Light from the light source may be applied to the inspection target in together with the electrical measurement, whereby the inspection target such as an imaging device or a display device can be measured under different optical conditions. In this case, since the tester is not present on the optical path from the light source to the inspection target, the optical path distance can be shortened. Since attenuation of light in the optical path can be thus reduced, the irradiation range is increased, whereby inspection throughput is improved.

A maintenance operation space for the interconnection board or the like can be easily secured by moving the light source to the escape position.

In the tester device, the interconnection board receiving unit may include an outer frame which is provided at one end of the tester section in a vertical direction and extends toward a side of the tester section;

the interconnection board may include: a first interconnection board electrically connected to the tester and disposed inside the outer frame and at a position facing the one end of the tester section; and a second interconnection board electrically connected to the first interconnection board and the contact section, and disposed inside the outer frame and at the side of the tester section; and the cut section may be provided in the second interconnection board.

If the second interconnection board is used as a functional board collectively provided with functions necessary for an inspection target, the replacement operation of the second interconnection board can be simplified.

In the tester device, a center position of the cut section may be disposed at a position biased toward the first interconnection board from a center position of the second interconnection board.

This reduces the signal path distance from the tester to the inspection target, whereby a measure against a high-frequency signal can be provided.

In the tester device, the interconnection board receiving unit may include a lid section which is able to be opened and shut and has an optical-path hole at a position facing the cut section in the second interconnection board.

The replacement of the interconnection board, especially the second interconnection board is further facilitated by moving the light source to the escape position and opening the lid section.

In the tester device, a first shielding section may be provided on an emission section of the light source; a second shielding section may be provided on a surface of the lid section; and the first and second shielding sections may be combined to shield around an optical path of the light source when the light source is set at the inspection position.

Moreover, the interconnection board receiving unit may further include a third shielding section which shields around an optical path of the light source. The third shielding section may include a first shielding ring disposed on the interconnection board. The contact section may include a mechanism which elastically connects the interconnection board to the external probe; and the third shielding section may include a reinforcement ring which comes in contact with the first shielding section. In addition to the shielding function, the reinforcement ring can prevent the interconnection board from being bent. The reinforcement ring may be fixed on the outer frame. In this case, an arm for fixing the reinforcement ring to the outer frame may be disposed at a position away from the second interconnection board to prevent components on the second interconnection board from interfering with the arm.

The third shielding section may include a second shielding ring which is provided on a back surface of the lid section and comes in contact with the reinforcement ring.

Since the second shielding ring is moved together with the lid section, the second shielding ring can be removed from the second interconnection board by opening the lid section, whereby a wider maintenance space can be secured.

In this tester device, the light source may be moved by swinging the light source, for example, but the moving mechanism is simplified by linearly moving the light source on the side of the tester section. In this case, a guide rail which guides the light source may be provided on a side surface of the tester section. The light source may be moved manually, but a driver section which linearly drives the light source may be provided.

In the tester device, the interconnection board receiving unit may be disposed at the side of the tester section and at a position biased to the front of the tester device. In particular, if the tester section and the interconnection board receiving unit are level on the front surface, operability by the operator is improved. In this case, the escape position of the light source can be disposed at the side of the tester section and at a position biased to the back of the tester device, and so an increase in space occupied by the device due to the escape position of the light source can be prevented.

In the tester device, leveling feet may be provided on a surface of the tester section in a vertical direction, the leveling feet being used to stand the tester device in an inverted state in which the contact section faces downward.

By enabling the tester device to be used both in the upright state and the inverted state, general purposeness can be increased.

A tester device according to one embodiment of the present invention includes a tester section which includes a tester, and an interconnection board receiving unit which is provided at one end of the tester section in a vertical direction and extends toward a side of the tester section, but does not include a light source.

Since some inspection targets can be inspected without the light source, general purposeness is further increased by using the same components other than the light source. Moreover, maintenance operability of the interconnection board, especially maintenance operability of the second interconnection board is similarly maintained without the light source.

In the tester device, the interconnection board receiving unit may further include:

a connector which connects the first and second interconnection boards;

an inner frame in which the second interconnection board is provided; and a pushing mechanism of the inner frame;

the outer frame may hold the first interconnection board, the connector, and the contact section and support the inner frame so that the inner frame is able to move horizontally in directions toward and away from the connector; and the pushing mechanism of the inner frame may include:

guide pins and engagement holes provided on outer walls of opposite sides of the inner frame;

guide grooves which are formed on inner walls of opposite sides of the outer frame and guide the guide pins in vertical and horizontal directions;

a shaft rotatably provided between the sides of the outer frame; and projection pins formed on the shaft to engage the engagement holes in the inner frame.

In this structure, the projection pin pushes the engagement hole by rotating the shaft. The inner frame is guided and horizontally moved by the guide pin and the guide groove in directions toward and away from the connector. Therefore, the second interconnection board provided in the inner frame can be connected/disconnected with/from the connector by the rotation of the shaft.

According to one embodiment of the present invention, there is provided an inspection device obtained by combining any of the above tester devices in an upright state with a prober device, or combining any of the above tester devices in an inverted state with a handler device.

According to one embodiment of the present invention, there is provided an interconnection board receiving unit comprising the above-described pushing mechanism of the inner frame.

These embodiments of the present invention are described below in detail with reference to the drawings.

Entire Device

Figure 2:
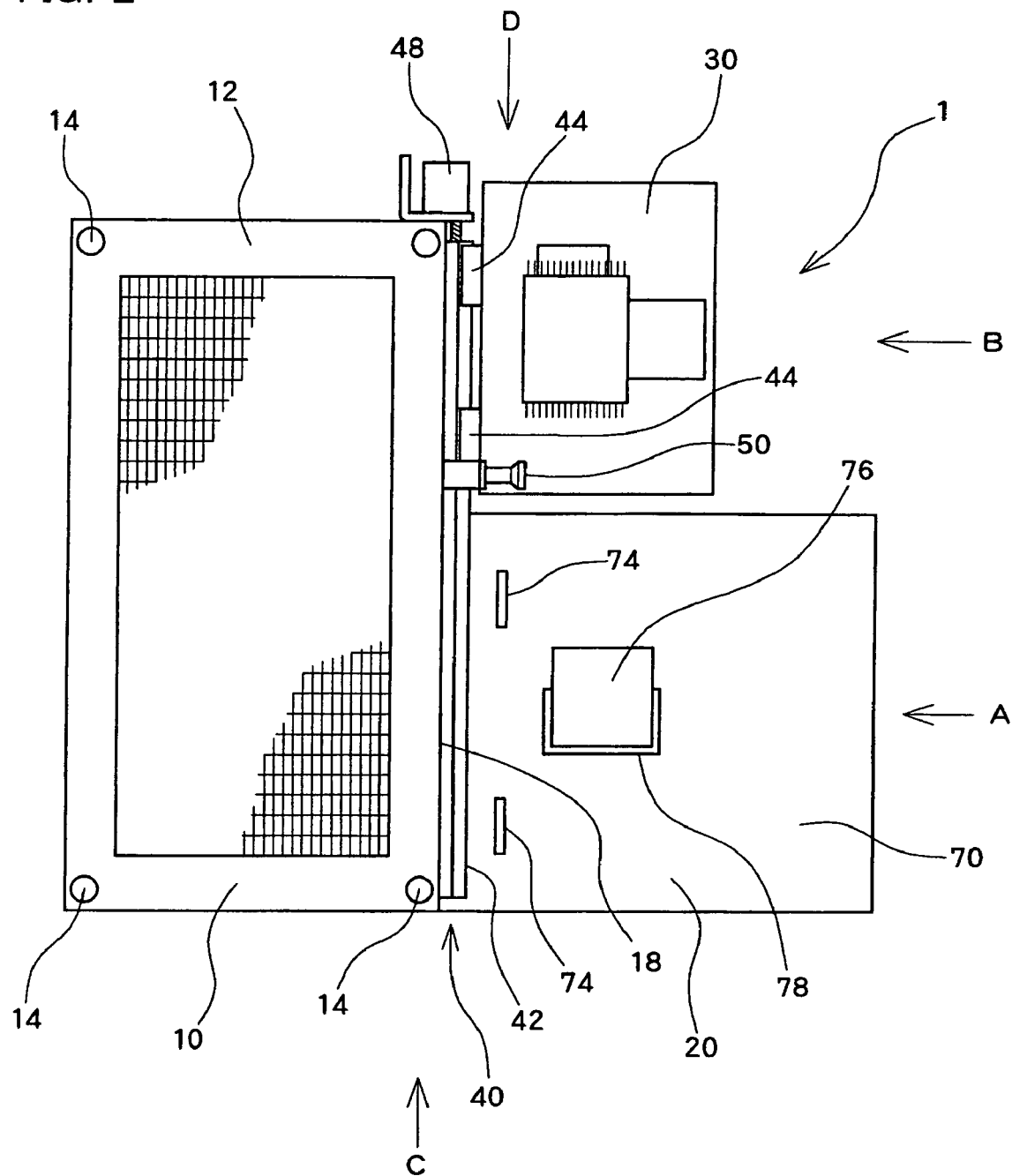
FIG. 2 is a plan view of the tester device shown in FIG. 1.
Figure 3:
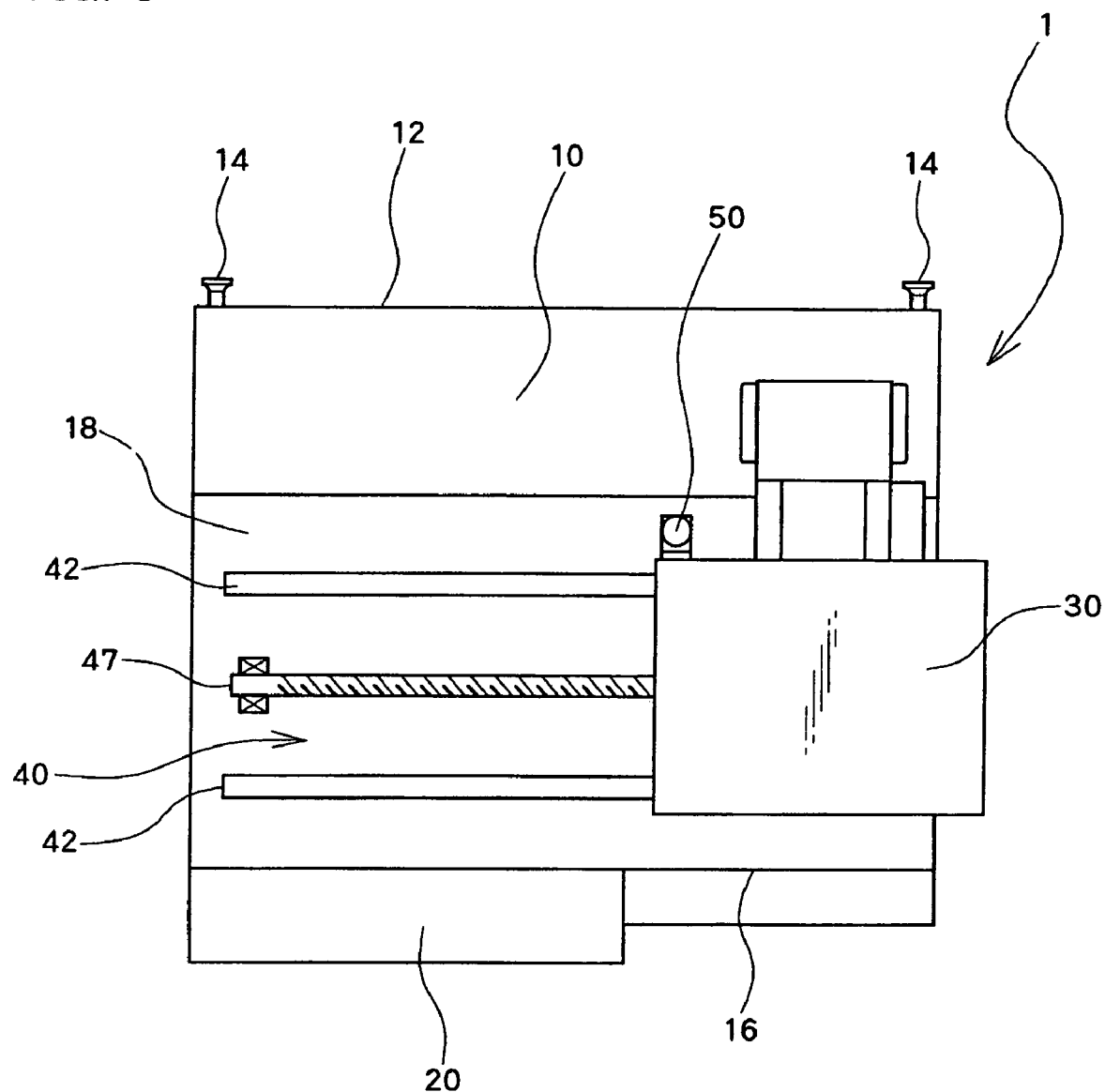
FIG. 3 is a right side view of the tester device shown in FIG. 1.
Figure 4:
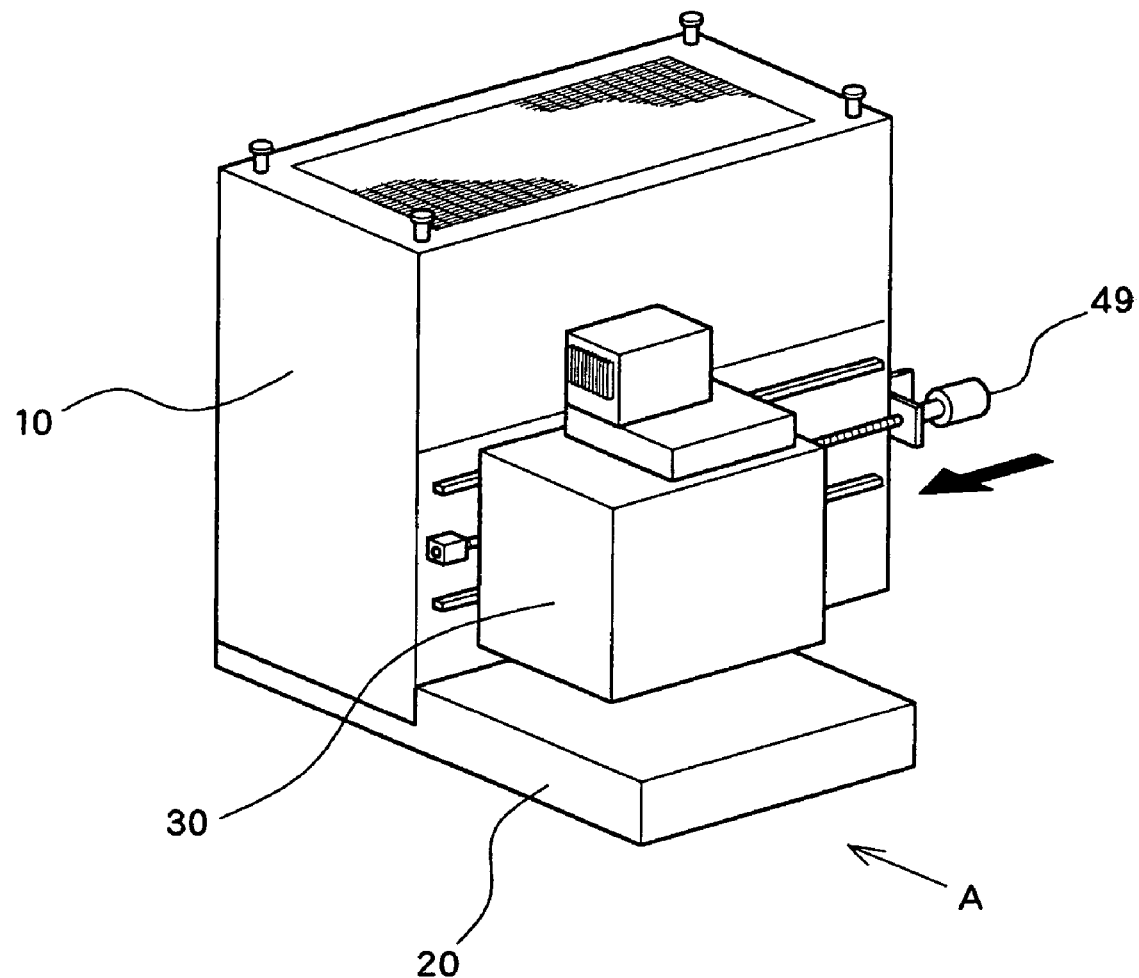
FIG. 4 is a schematic perspective view of a tester device in a state in which a light source is placed at an inspection position.
Figure 5:
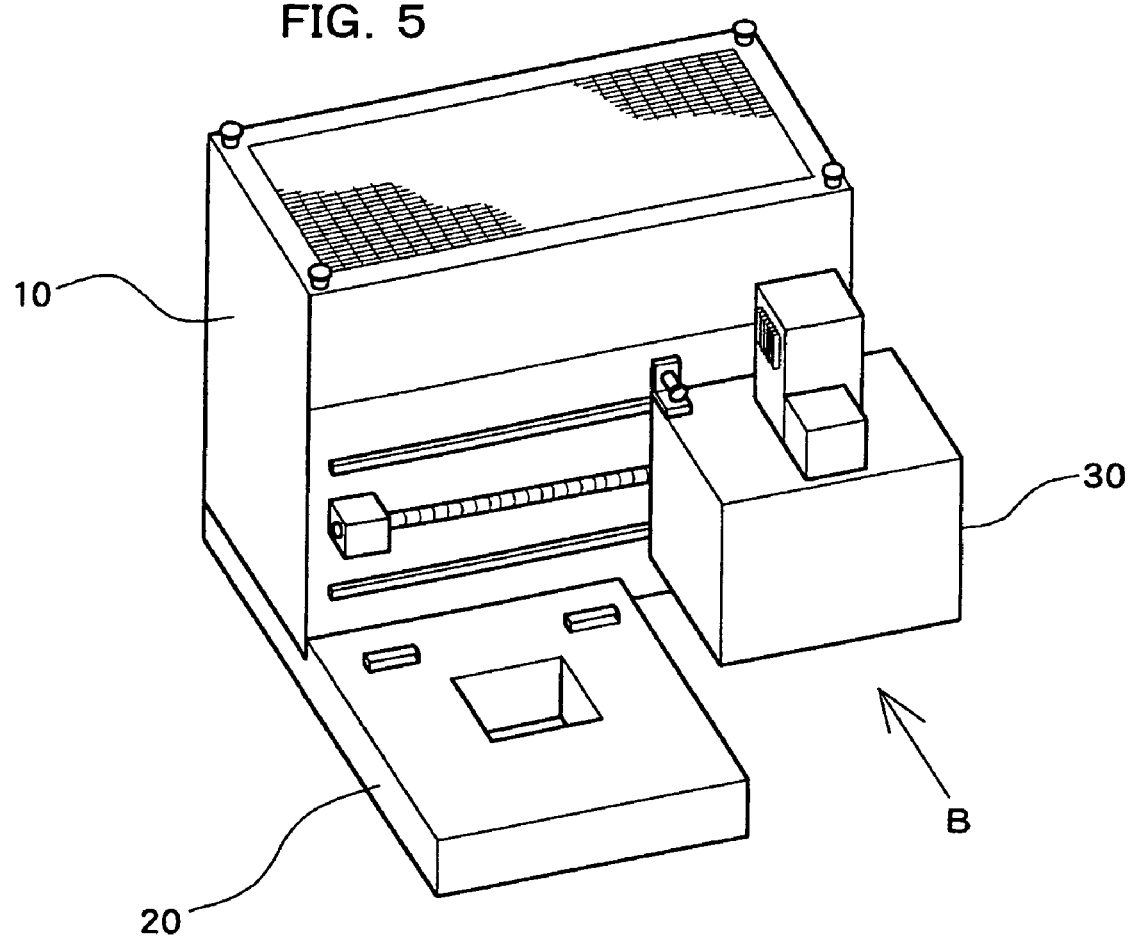
FIG. 5 is also a schematic perspective view of a tester device in a state in which a light source is placed at an escape position.

FIGS. 1 to 3 are a front view, a plan view, and a right side view of a tester device 1 which is used in an upright state and in which a light source 30 is located at an escape position B. FIG. 4 is a schematic perspective view showing a state in which the light source 30 is placed at an inspection position A, and FIG. 5 is a schematic perspective view showing a state in which the light source is placed at the escape position B.

In FIGS. 1 to 5, the tester device 1 includes a tester section 10 which includes a tester (not shown), an interconnection board receiving unit 20 fixed on the tester section 10, and the light source 30. As shown in FIGS. 1 to 5, when the tester device 1 is placed in the upright state, the light source 30 is moved above the interconnection board receiving unit 20. The tester device 1 may be used in an inverted state (see FIG. 6). Therefore, leveling feet 14 for supporting the tester section 10 in the inverted state are provided on a top surface 12 of the tester section 10 in the upright state (see FIGS. 1 and 6).

The interconnection board receiving unit 20 is provided at a bottom surface 16 of the tester section 10 in the upright state and horizontally extends from the bottom surface 16 toward the side of the tester section 10. The light source 30 is movably supported on a side surface 18 of the tester section 10.

In this embodiment, the light source 30 can be linearly moved on the side surface 18 of the tester section 10, for example. Therefore, a linear moving mechanism 40 shown in FIGS. 1 to 3 is provided on the side surface 18 of the tester section 10. The linear moving mechanism 40 may include guide rails 42 provided on the side surface 18 of the tester section 10. The guide rails 42 linearly guide each of guide target sections 44 provided on the light source 30. The moving mechanism 40 may further include a driver section 46 of the light source 30. The driver section 46 may be formed by a ball screw 47, a motor 48 which drives the ball screw 47, and a nut section 49 which is provided on the light source 30 and is linearly moved by the rotation of the ball screw 47. The light source 30 may be manually moved without providing the driver section 46. In this case, a mechanism for maintaining the light source 30 at a standstill position such as a fixing pin 50 may be provided.

As shown in FIG. 2, the interconnection board receiving unit 20 is disposed at a position biased toward a front surface C of the tester device 1 on the side of the tester section 10. Therefore, the escape position B of the light source 30 is disposed on the side of a rear surface D of the tester device 1, as shown in FIG. 2.

A start switch (not shown) of the driver section 44 may be disposed on the side of the front surface C of the tester device 1 in order to move the light source 30. In a model in which the driver section 44 is not provided, the operator positioned on the side of the front surface C of the tester device 1 manually moves the light source 30. In this case, a mechanism for pulling the light source 30 placed at the escape position B on the side of the rear surface D of the tester device 1 toward the front surface C may be provided.

Interconnection Board Receiving Unit

Figure 7:
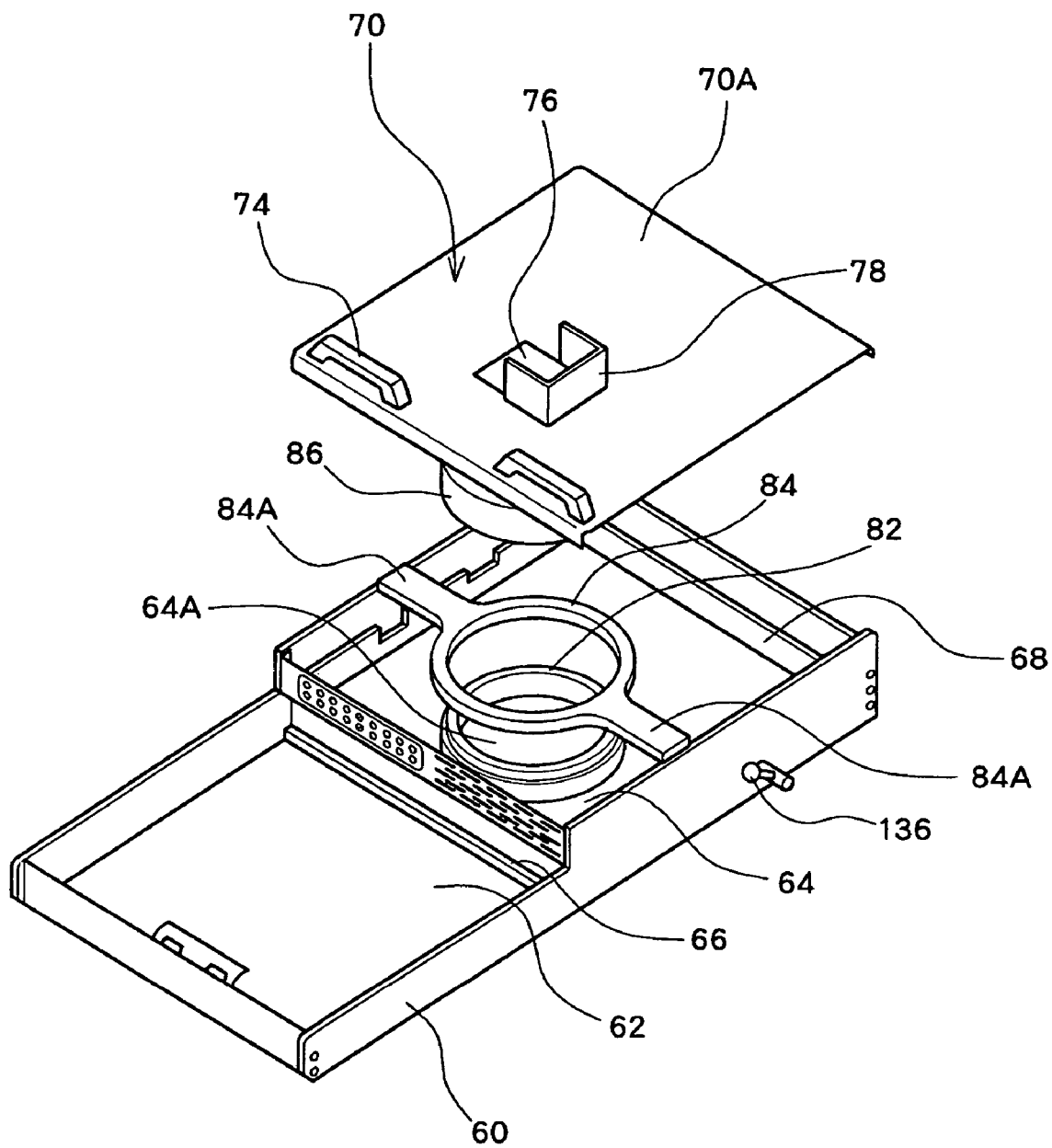
FIG. 7 is a schematic perspective view of an interconnection board receiving unit of the tester device.
Figure 8:
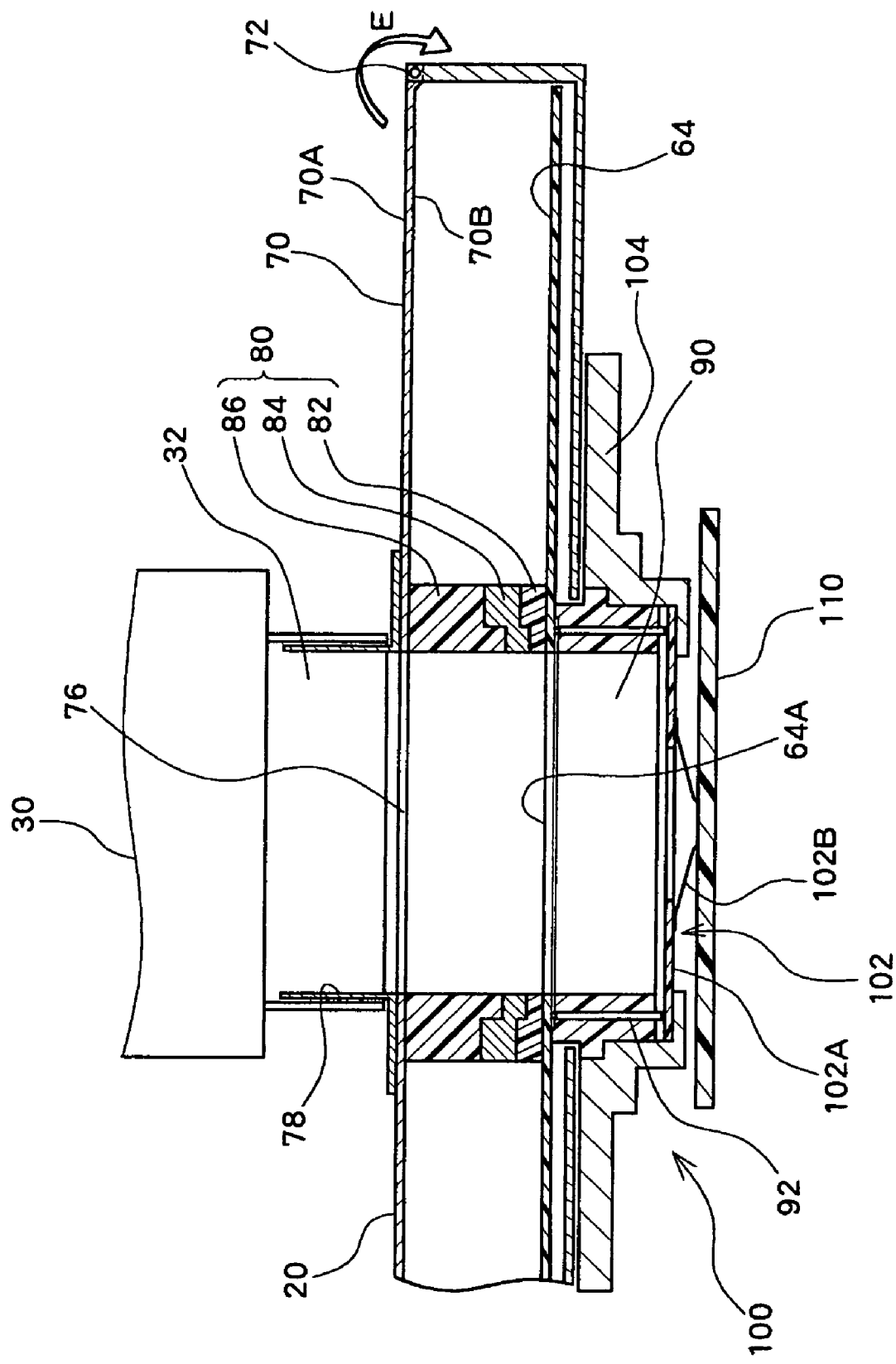
FIG. 8 is a partial cross-sectional view of an interconnection board receiving unit and a prober device disposed below the interconnection board receiving unit.

The details of the interconnection board receiving unit 20 are described below with reference to FIGS. 7 and 8. FIG. 7 is a schematic perspective view of the interconnection board receiving unit 20, and FIG. 8 is a partial cross-sectional view of the interconnection board receiving unit 20. The interconnection board receiving unit 20 includes an outer frame 60 which receives an interconnection board connected with the tester inside the tester section 10. In this embodiment, the interconnection board includes a first interconnection board such as a device interface board (DIB) 62, and a second interconnection board such as a device under test (DUT) board 64. The first interconnection board 62 is disposed at a position facing the bottom surface 16 of the tester section 10 and is connected with the tester (not shown) inside the tester section 10. The first interconnection board 62 is used to arrange signals from clock and power supply sources provided inside the tester or the like. The second interconnection board 64 includes a cut section 64A for an optical-path. When the light source 30 is placed at the inspection position A, the optical path of the light source 30 faces the cut section 64A of the second interconnection board 64.

A connector 66 which electrically connects the first and second interconnection boards 62 and 64 is disposed on the outer frame 60. The second interconnection board 64 is installed on an inner frame 68, and the first and second interconnection boards 62 and 64 are connected through the connector 66 by horizontally moving the inner frame 68. The connection mechanism is described later.

As shown in FIGS. 7 and 8, a lid section 70 which can be opened and shut is provided inside the outer frame 60 at a position facing the second interconnection board 64. As shown in FIG. 8, the lid section 70 can be opened through a hinge 72 in the direction of an arrow E shown in FIG. 8, and includes a grip 74 for this operation. The lid section 70 is opened and shut when the light source 30 is placed at the escape position B as shown in FIG. 2. In other words, the light source 30 which hinders the open-shut operation of the lid section 70 is moved from the inspection position A to the escape position B. The lid section 70 is provided in order to secure operability of maintenance such as replacement of the second interconnection board 64.

The first interconnection board 62 such as the DIB can be commonly used for various inspection targets. On the other hand, the second interconnection board 64 such as the DUT board is a functional board which is collectively provided with functions necessary for each type of inspection target, and must be replaced corresponding to each inspection target. Therefore, the operational space is secured by moving the light source 30 to the escape position and opening the lid section 70, whereby operability of the maintenance operation such as replacement is improved.

An optical-path hole 76 is formed in the lid section 70. A first shielding section 78 which rises from a surface 70A of the lid section 70 is provided around the optical-path hole 76. In the case where the hole 76 is quadrilateral, the first shielding section 78 is formed in the shape of the letter "U" in a plan view. Specifically, a cut is formed on the upstream side in the moving direction of the light source 30 when the light source 30 is placed at the inspection position A. As shown in FIG. 8, a second shielding section 32 is provided on the bottom surface of the light source 30. The second shielding section 32 is formed in the shape of the letter "U" in a plan view in the same manner as the first shielding section 78. The first and second shielding sections 78 and 32 are disposed so that the opening sides of the letter "U" face each other, whereby the first and second shielding sections 78 and 32 do not interfere with each other when moving the light source 30. When the light source 30 is placed at the inspection position A, the first and second shielding sections 78 and 32 are combined as shown in FIG. 8, thereby shielding (enclosing) around the optical path of the light source 30 in the space between the light source 30 and the interconnection board receiving unit 20.

Figure 9:
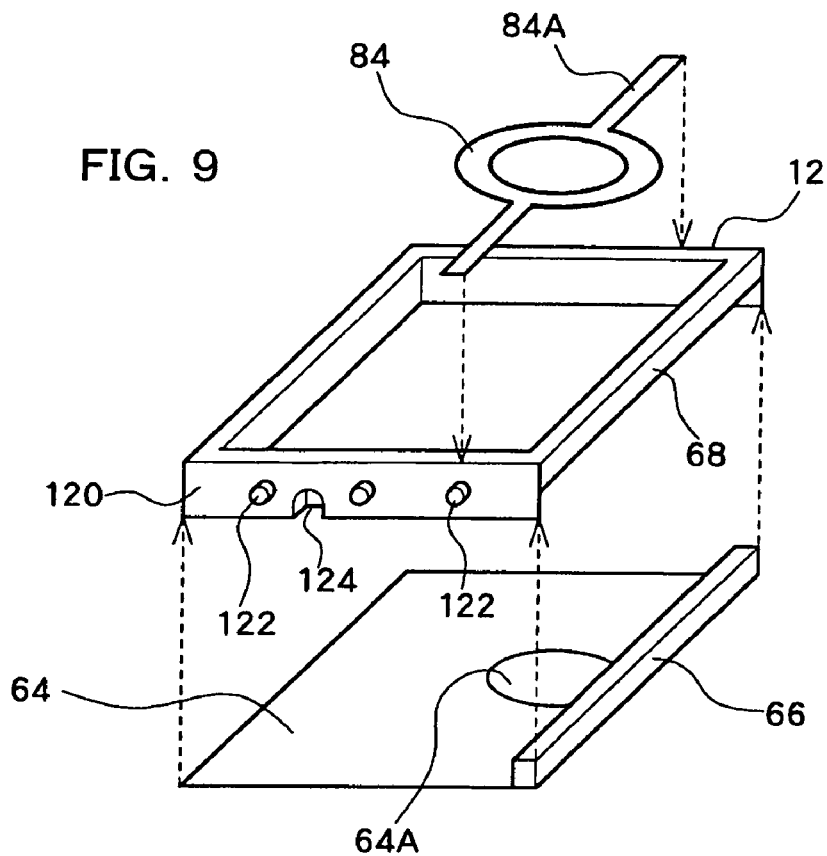
FIG. 9 is a perspective view of an inner frame of an interconnection board receiving unit.

A third shielding section 80 may be provided inside the interconnection board receiving unit 20. In this embodiment, the third shielding section 80 is divided into a plurality of (three, for example) sections (see FIG. 8). A first shielding ring 82 is disposed to enclose the cut section 64A on the second interconnection board 64. A reinforcement ring 84 is disposed on the second shielding ring 82. The reinforcement ring 84 is formed of a rigid material such as a metal, and two arms 84A are fixed on the inner frame 68 as shown in FIGS. 7 and 9, for example. The reinforcement ring 84 exhibits shielding properties. A second shielding ring 86 is disposed on the reinforcement ring 84. As shown in FIG. 8, the closely stacked first and second shielding rings 82 and 86 and reinforcement rings 84 shield around the optical path of the light source 30 inside the interconnection board receiving unit 20. The ring shape of each of the shielding sections 82 to 86 is not limited to a circle as shown in the drawing. The ring shape may be quadrilateral. The reason that the reinforcement ring 84 is provided between the first and second shielding rings 82 and 86 is described later. The material for the first and second shielding rings 82 and 86 is not limited insofar as the first and second shielding rings 82 and 86 exhibit shielding properties. For example, the first and second shielding rings 82 and 86 may be formed of a resin or the like.

It is preferable that the second shielding ring 86 can be removed from the shielding position. For example, the second shielding ring 86 may be fixed on a back surface 70B of the lid section 70 as shown in FIG. 8. A wider maintenance space of the second interconnection board 64 can be secured by opening the lid section 70 and removing the second shielding ring 86.

As shown in FIG. 8, the interconnection board receiving unit 20 includes a contact section 90 under the second interconnection board 64. When using the tester device 1 in the upright state, a prober device 100 is disposed under the interconnection board receiving unit 20, whereby an inspection device for the inspection target such as a semiconductor wafer is formed by the tester device 1 and the prober device 100. In the prober device 100, a probe such as a probe card 102, which comes in contact with the inspection target such as a semiconductor wafer 110, is supported by an insert ring 104. As shown in FIG. 8, the probe card 102 includes a substrate 102A and a probe pin 102B supported by the substrate 102A. The contact section 90 electrically connects the probe card 102 with the second interconnection board 64. The contact section 90 may include a connection pin 92 called a pogo pin which elastically comes in contact with the probe card 102.

In the inspection state shown in FIG. 8, if one connection pin 92 applies a repulsion force of 60 g to the second interconnection board 64, for example, a repulsion force of "total number (360, for example) of connection pins 92×60 g" is applied to the second interconnection board 64. Therefore, the second interconnection board 64 is bent unless the second interconnection board 64 is reinforced by increasing the thickness, for example. The reinforcement ring 84 is also used as the shielding ring in order to prevent the second interconnection board 64 from being bent.

Since the reinforcement ring 84 is provided in the second layer of the third shielding section 80 formed on the first shielding ring 82, an electric/electronic part (not shown) mounted on the second interconnection board 64 does not interfere with the arms 84A. In other words, the height of the first shielding ring 82 is set to be equal to or greater than the maximum height of the electric/electronic part mounted on the second interconnection board 64.

In this embodiment, a measure against a high frequency signal transmitted and received between the tester and the inspection target is provided. The influence of noise occurs to a smaller extent as the transmission/reception distance between the tester and the inspection target is decreased. Therefore, the center of the cut section 64A is shifted toward the first interconnection board 62 with respect to the center of the second interconnection board 64 (see FIG. 8). This decreases the transmission/reception distance. The maximum shift of the center of the cut section 64A is determined by securing the minimum distance from the inner edge of the cut section 64A to the side edge of the second interconnection board 64 from the viewpoint of the board strength.

Inspection Method

The tester device 1 shown in FIGS. 1 to 8 is used in combination with the prober device 100 as shown in FIG. 8 during use in the upright state. As shown in FIG. 8, the prober device 100 causes the semiconductor wafer 110 removed from a cassette to come in contact with the probe pin 102B. This causes at least one chip on the semiconductor wafer 110 to be connected with the tester inside the tester section 10 through the probe card 102, the contact section 90, the first and second interconnection boards 62 and 64, and the connector 66.

Whether or not the chip is defective is judged in this state using the tester by supplying a signal from the tester inside the tester section 10 and measuring an output signal from at least one chip on the semiconductor wafer 110. An electrical measurement of all the chips on the semiconductor wafer 110 can be achieved by changing the position of the semiconductor wafer 110 by driving the stage inside the prober device 100.

In the inspection device in this embodiment, light may be applied to the chip on the semiconductor wafer 110 from the light source 30, if necessary, in combination with the electrical measurement step. This type of measurement is demanded when the inspection target is an imaging device or a display device. As the imaging device, a CCD, CMOS image sensor, or the like can be given. As the display device, an LCD or the like can be given. The electrical characteristics of such an inspection target are measured while changing optical conditions by increasing the luminous intensity stepwise from the state in which light is not applied.

Therefore, the light source 30 is placed at the inspection position A shown in FIG. 4. The light from the light source 30 is applied to the inspection target 110 through the optical-path hole 76 in the lid section 70 and the cut section 64A in the second interconnection board 64 while the first to third shielding sections 78, 32, and 80 shielding around the light. In this embodiment, since the optical path length is not increased differing from Japanese Patent Application Laid-open No. 2000-137058 and Japanese Patent Application Laid-open No. 2000-147065, light attenuates to only a small extent in the optical path, whereby the irradiation area on the surface of the inspection target can be increased. In the conventional technology, the inspection range is limited by the irradiation range in which a predetermined intensity can be secured rather than the electrical performance of the tester section 10. According to this embodiment, the range (irradiation range) in which the semiconductor wafer 110 can be measured without driving the semiconductor wafer 110 stepwise can be increased, whereby inspection throughput can be improved.

In the inspection device of this embodiment, it is unnecessary to rotate the heavy tester section around a hinge, differing from Japanese Patent Application Laid-open No. 2000-137058 and Japanese Patent Application Laid-open No. 2000-147065. The light source 30 is moved to the escape position B at the time of maintenance. Since the light source 30 is lightweight in comparison with the tester section described in Japanese Patent Application Laid-open No. 2000-137058 and Japanese Patent Application Laid-open No. 2000-147065, the size and weight of the moving mechanism 40 and the driving mechanism 44 can be reduced.

The second shielding ring 86 can be removed by opening the lid section 70 after moving the light source 30 to the escape position, whereby the operation space for replacement of the second interconnection board 64 or the like can be sufficiently secured.

This type of device is disposed in a cleanroom of which the cost per unit area is high. The device in present embodiment enables omission of a manipulator section including a hinge mechanism of the tester section which is indispensable in Japanese Patent Application Laid-open No. 2000-137058 and Japanese Patent Application Laid-open No. 2000-147065, whereby the installation area can be reduced. Therefore, running cost of inspection is reduced.

Mechanism For Removing Second Interconnection Board

Figure 10:
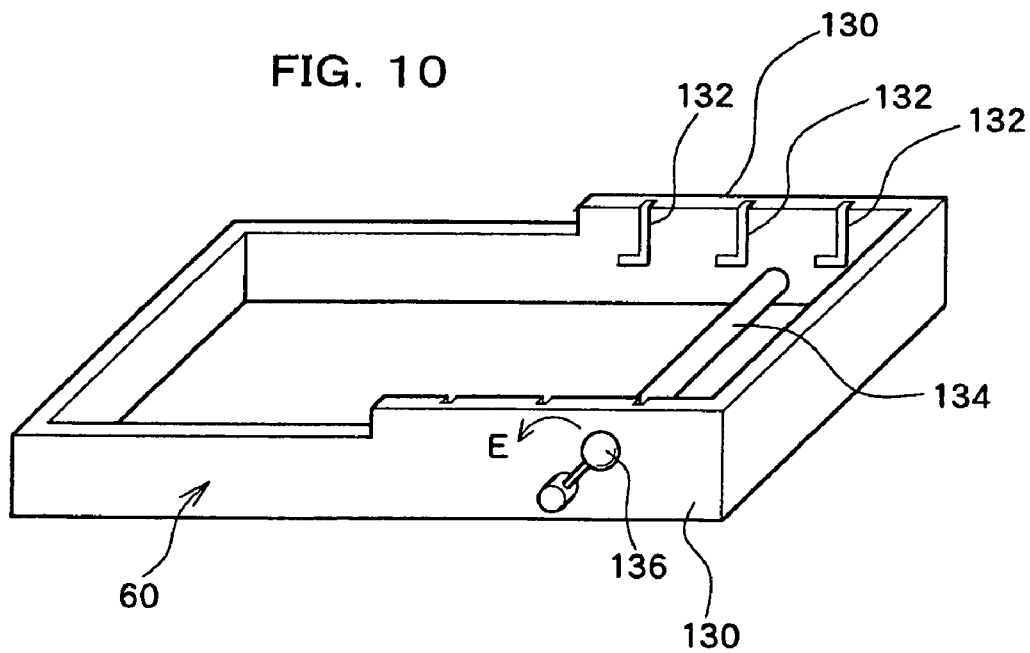
FIG. 10 is also a perspective view of an outer frame of an interconnection board receiving unit.
Figure 11:
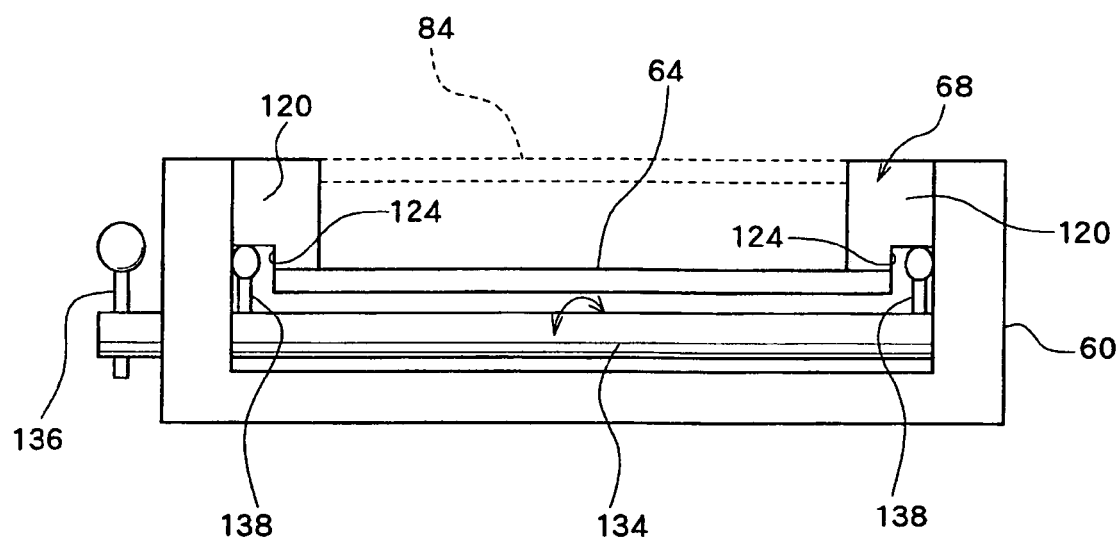
FIG. 11 is a cross-sectional view showing a pushing mechanism of an inner frame.

A function further added to the interconnection board receiving unit 20 is described below. FIG. 9 is a perspective view of the inner frame 68 of the interconnection board receiving unit 20. FIG. 10 is a perspective view of the outer frame 60 of the interconnection board receiving unit 30. FIG. 11 is a cross-sectional view showing a pushing mechanism of the inner frame 68.

In FIG. 9, the inner frame 68, on which the second interconnection board 64 (omitted in FIG. 9) is provided, includes a plurality of (three, for example) guide pins 122 which project from the outer surfaces of opposite sides 120 (only one side is shown in FIG. 9). U-shaped engagement holes 124 are formed in the sides 120, for example.

As shown in FIG. 10, a plurality of (three, for example) L-shaped guide grooves 132 are formed in the inner walls of sides 130 (only one inner wall is shown in FIG. 10) of the outer frame 60, which face each other at a position at which the second interconnection board 64 is disposed. A corresponding guide pin 122 of the inner frame 68 is inserted into each of the guide grooves 132 from the opening at the upper edge. As shown in FIGS. 10 and 11, a shaft 134 is rotatably provided between the sides 130 of the outer frame 60. One end of the shaft 134 extends toward the outside through one of the sides 130, and a lever 136 is fixed on the projecting end section of the shaft 134. The shaft 134 is rotated by the rotational operation of the lever 136. As shown in FIG. 11, projection pins 138 which project in the radial direction of the shaft are fixed on the shaft 134 at two positions.

An operation of connecting the first and second interconnection boards 62 and 64 through the connector 66 in the interconnection board receiving unit 20 having the above-described structure is described below. As shown in FIG. 11, the second interconnection board 64 is fixed by the inner frame 68.

The inner frame 68 is placed in the outer frame 60 provided with the first interconnection board 62 and the connector 66 (female connector, for example). The guide pins 122, which project from the opposite sides of the inner frame 68, are inserted into the L-shaped guide grooves 132 formed in the inner walls of the sides 130 of the outer frame 60. The guide pin 122 of the inner frame 68 is guided along the vertical groove of the guide groove 132, whereby the inner frame 68 is lowered vertically. This causes two projection pins 138 of the shaft 134 to be disposed in the U-shaped engagement holes 124 of the inner frame 68, as shown in FIG. 11.

Figure 12:
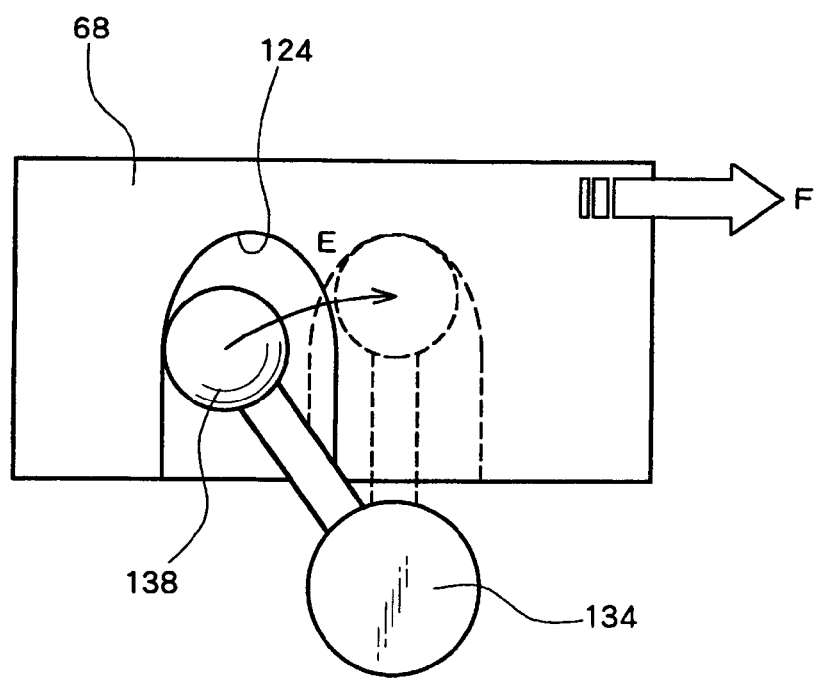
FIG. 12 is a schematic view illustrating a pressure movement operation of an inner frame due to engagement of a projection pin of a shaft and an engagement hole.

The lever 136 of the shaft 134 is rotated in the direction of the arrow E shown in FIGS. 10 and 12. As a result, the projection pins 138 are rotated in the direction of the arrow E together with the shaft 134, as shown in FIG. 12. The projection pin 138 engages the engagement hole 124 in the inner frame 68, thereby horizontally moving the inner frame 68 in the direction of an arrow F shown in FIG. 12. The guide pin 122 of the inner frame 68 is horizontally moved and guided along the horizontal groove of the L-shaped guide groove 132 in the outer frame 60. Therefore, the second interconnection board 68 is horizontally moved together with the inner frame 68, whereby the female connector 66 of the first interconnection board 62 is connected with the female connector 66 of the second interconnection board 68. This enables the connectors 66 having a number of connection points to be connected by uniformly pressing the second interconnection board 68 in the widthwise direction. The connection can be released by rotating the lever 136 in the direction reverse to the direction of the arrow E shown in FIGS. 10 and 12.

The load imposed on the replacement operation of the second interconnection board 64 specific to each inspection target is significantly reduced by providing the removing mechanism of the second interconnection board 64 in the interconnection board receiving unit 20. Moreover, a complicated configuration such as a pogo pin or a negative pressure supply can be omitted when connecting the connectors at a number of points.

Use Of Tester Device In Inverted State

Figure 6:
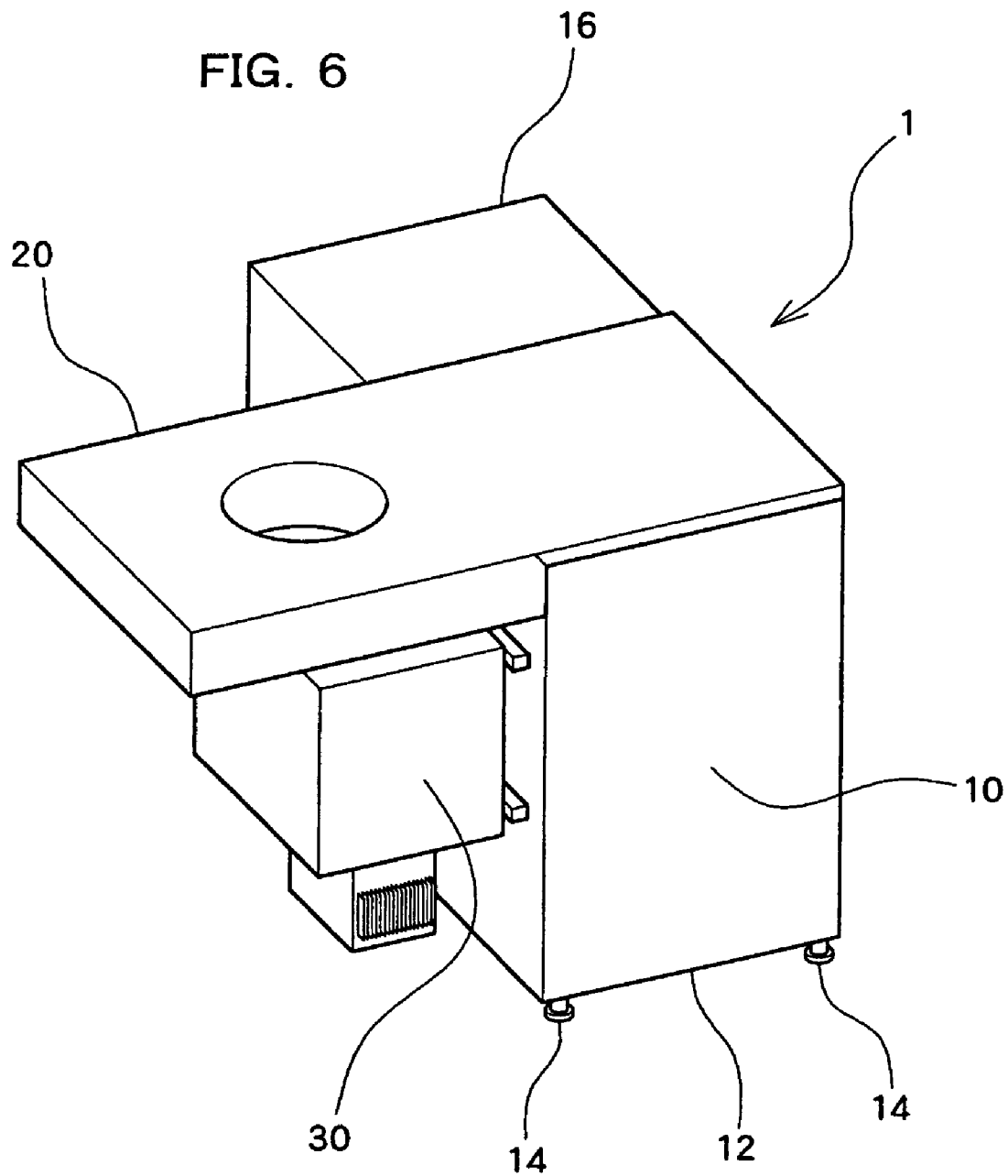
FIG. 6 is a schematic perspective view of a tester device in an inverted state.

The case of using the tester device 1 in the inverted state as shown in FIG. 6 is described below. In this case, the tester device 1 is used in combination with a handler device (not shown). Specifically, the connector section 90 of the tester device 1 shown in FIG. 6 is located at a lower position facing the inspection target disposed inside the handler device. The handler device differs from the prober device 100 shown in FIG. 8 in that the inspection target of the prober device 100 is a substrate such as the semiconductor wafer 110 during manufacture and the inspection target of the handler device is a completed product which is packaged in chip units.

In this embodiment, since the leveling feet 14 are provided in order to deal with such an inverted use, general purposeness of the tester device 1 can be increased.

Tester Device Without Light Source

In the above-described embodiment, the tester device may be configured without using the light source 30. The shielding structures 32, 78, and 80 to 86 for the light source 30 and the moving mechanisms 40 to 50 of the light source 30 may be removed when the light source 30 is removed. The optical-path hole 76 in the lid section 70, the cut section 64A in the second interconnection board 64, and the like may be utilized as a probe positioning window.

The tester device without a light source may be used for an inspection target for which a light source is unnecessary for electrical measurement inspection. As such an inspection target, a semiconductor device such as an IC and LSI, a display device such as a transparent type and reflection type LCD or EL, or the like can be given. The light source 30 is necessary depending on the type of display device or the inspection. However, the inspection target may be inspected without using the light source 30.

The maintenance operation of the interconnection board is reduced by configuring the interconnection board receiving unit 20 as described above, even when using the tester device without the light source 30.

Although only some embodiments of the present invention have been described in detail above, those skilled in the art will readily appreciate that many modifications are possible in the embodiments without departing from the novel teachings and advantages of this invention. Accordingly, all such modifications are intended to be included within the scope of this invention.

For example, in the tester device 1 with the light source 30, the movement of the light source 30 is not necessarily limited to the linear movement, and may be a swing movement.

What is claimed is:

1. A tester device comprising:
    a tester section which includes a tester; and
    an interconnection board receiving unit which is provided at one end of the tester section in a vertical direction and extends toward a side of the tester section,
    wherein the interconnection board receiving unit includes:
    an interconnection board electrically connected to the tester in the tester section;
    a contact section electrically connecting the interconnection board to an external probe; and
    an outer frame which holds the interconnection board and the contact section; and
    wherein the interconnection board includes:
    a first interconnection board electrically connected to the tester and disposed inside the outer frame and at a position facing the one end of the tester section; and
    a second interconnection board electrically connected to the first interconnection board and the contact section, and disposed inside the outer frame and at the side of the tester section.

2. The tester device as defined in claim 1, wherein the interconnection board receiving unit further includes:
    a connector which connects the first and second interconnection boards;
    an inner frame in which the second interconnection board is provided; and
    a pushing mechanism of the inner frame;
    wherein the outer frame holds the first interconnection board, the connector, and the contact section and supports the inner frame so that the inner frame is able to move horizontally in directions toward and away from the connector; and
    wherein the pushing mechanism of the inner frame includes:
    guide pins and engagement holes provided on outer walls of opposite sides of the inner frame;
    guide grooves which are formed on inner walls of opposite sides of the outer frame and guide the guide pins in vertical and horizontal directions;
    a shaft rotatably provided between the sides of the outer frame; and
    projection pins formed on the shaft to engage the engagement holes in the inner frame.

* * * * *